(12) United States Patent
Ahn et al.

(10) Patent No.: US 7,465,982 B2
(45) Date of Patent: Dec. 16, 2008

(54) CAPACITOR STRUCTURES

(75) Inventors: Kie Y. Ahn, Chappaqua, NY (US); Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 406 days.

(21) Appl. No.: 10/931,544

(22) Filed: Aug. 31, 2004

(65) Prior Publication Data
US 2005/0037563 A1 Feb. 17, 2005

Related U.S. Application Data

(62) Division of application No. 10/174,434, filed on Jun. 17, 2002, which is a division of application No. 09/881,408, filed on Jun. 13, 2001, now Pat. No. 7,037,862.

(51) Int. Cl.
*H01L 27/108* (2006.01)
(52) U.S. Cl. ................................................. 257/310
(58) Field of Classification Search ........... 257/306, 257/310, 303, E21.01, 330–333, E21.648, 257/295; 348/240
See application file for complete search history.

(56) References Cited

U.S. PATENT DOCUMENTS

| | | | |
|---|---|---|---|
| 4,432,035 A | 2/1984 | Hsieh et al. |
| 4,464,701 A | 8/1984 | Roberts et al. |
| 5,346,600 A | 9/1994 | Nieh et al. |
| 5,554,564 A | 9/1996 | Nishioka et al. |
| 5,566,045 A | 10/1996 | Summerfelt et al. |
| 5,605,858 A | 2/1997 | Nishioka et al. |
| 5,912,797 A | 6/1999 | Schneemeyer et al. |
| 6,013,553 A | 1/2000 | Wallace et al. |
| 6,020,024 A | 2/2000 | Maiti et al. |
| 6,020,243 A | 2/2000 | Wallace et al. |
| 6,172,385 B1 | 1/2001 | Duncombe et al. |
| 6,184,072 B1 | 2/2001 | Kaushik et al. |
| 6,200,893 B1 | 3/2001 | Sneh |
| 6,207,589 B1 | 3/2001 | Ma et al. |
| 6,297,539 B1 | 10/2001 | Ma et al. |
| 6,300,202 B1 | 10/2001 | Hobbs et al. |

(Continued)

OTHER PUBLICATIONS

W.-H. Lee et al., "A Novel High-k Inter-Poly Dielectric (IPD), $Al_2O_3$ for Low Voltage/High speed Flash Memories: Erasing in msecs at 3.3V," p. 117-118, (1997).

(Continued)

*Primary Examiner*—Nathan W Ha
(74) *Attorney, Agent, or Firm*—Wells St. John P.S.

(57) ABSTRACT

Embodiments in accordance with the present invention provide alternative materials, and methods of forming such materials, that are effective as dielectric layers. Such embodiments include forming metal-containing dielectric layers over a silicon-containing substrate where a metal-containing layer is first formed and that treated to form a dielectric layer. Dielectric layers formed by methods of the present invention have a dielectric constant greater than that of silicon dioxide, and can have an equivalent oxide thickness of less than 2 nanometers. Such dielectric layers are useful in the forming of a variety of semiconductor devices such as transistors, capacitors and the like where such devices and integrated circuits formed from such devices are encompassed by embodiments in accordance with the present invention.

16 Claims, 4 Drawing Sheets

U.S. PATENT DOCUMENTS

| | | | |
|---|---|---|---|
| 6,348,373 | B1 | 2/2002 | Ma et al. |
| 6,348,386 | B1 | 2/2002 | Gilmer |
| 6,383,873 | B1 | 5/2002 | Hegde et al. |
| 6,387,761 | B1 | 5/2002 | Shih et al. |
| 6,392,257 | B1 | 5/2002 | Ramdani |
| 6,395,650 | B1 | 5/2002 | Callegari et al. |
| 6,395,659 | B2 | 5/2002 | Seto et al. |
| 6,399,521 | B1 | 6/2002 | Zhang et al. |
| 6,407,422 | B1 | 6/2002 | Asano et al. |
| 6,407,435 | B1 * | 6/2002 | Ma et al. .................... 257/411 |
| 6,436,777 | B1 | 8/2002 | Ota |
| 6,444,512 | B1 | 9/2002 | Madhukar |
| 6,444,592 | B1 | 9/2002 | Ballantine et al. |
| 6,476,454 | B2 | 11/2002 | Suguro |
| 6,495,474 | B1 | 12/2002 | Rafferty et al. |
| 6,495,890 | B1 | 12/2002 | Ono |
| 6,514,828 | B2 | 2/2003 | Ahn et al. |
| 6,525,967 | B1 | 2/2003 | Briner |
| 6,544,875 | B1 | 4/2003 | Wilk |
| 6,573,160 | B2 | 6/2003 | Taylor et al. |
| 6,573,197 | B2 | 6/2003 | Callegari |
| 6,632,729 | B1 | 10/2003 | Paton |
| 6,660,660 | B2 | 12/2003 | Haukka et al. |
| 6,679,996 | B1 | 1/2004 | Yao |
| 6,713,846 | B1 | 3/2004 | Senzaki |
| 6,784,508 | B2 | 8/2004 | Tsunashima et al. |
| 6,984,591 | B1 | 1/2006 | Buchanan et al. |
| 7,049,192 | B2 | 5/2006 | Ahn et al. |
| 2001/0013629 | A1 | 8/2001 | Bai |
| 2001/0021589 | A1 | 9/2001 | Wilk |
| 2001/0023120 | A1 | 9/2001 | Tsunashima et al. |
| 2001/0024868 | A1 | 9/2001 | Nagel et al. |
| 2002/0006708 | A1 | 1/2002 | Kang et al. |
| 2002/0047170 | A1 | 4/2002 | Ota |
| 2002/0048910 | A1 | 4/2002 | Taylor et al. |
| 2002/0089023 | A1 | 7/2002 | Yu et al. |
| 2002/0094643 | A1 | 7/2002 | Solomon et al. |
| 2002/0100946 | A1 | 8/2002 | Muller et al. |
| 2002/0106536 | A1 | 8/2002 | Lee et al. |
| 2002/0145168 | A1 | 10/2002 | Bojarczuk, Jr. |
| 2002/0175393 | A1 | 11/2002 | Baum et al. |
| 2002/0190302 | A1 | 12/2002 | Bojarczuk et al. |
| 2003/0027360 | A1 | 2/2003 | Hsu |
| 2004/0043557 | A1 * | 3/2004 | Haukka et al. .............. 438/240 |
| 2006/0006497 | A1 * | 1/2006 | Ahn et al. .................... 257/532 |

OTHER PUBLICATIONS

Xin Guo et al., "High Quality Ultra-thin (1.5 nm) $TiO_2/Si_3N_4$ Gate Dielectric for Deep Sub-micron CMOS technology," 4 pages, (1999).

H.F. Luan et al., "High Quality $Ta_2O_5$ Gate Dielectric with $T_{ax,eq}$<A," 4 pages, (1999).

K.J. Hubbard[a] et al., "Thermodynamic Stability of Binary Oxides in Contact with Silicon," p. 2757-2776, (1996).

B. Cheng et al., "The Impact of High-K Gate Dielectrics and Metal Gate Electrodes on Sub-100 nm MOSFET's," p. 1537-1544, (1999).

C.T. Liu, "Circuit Requirement and Integration Challenges of Thin Gate Dielectrics for Ultra Small MOSFETs," 4 pages, (1998).

B.H. Lee et al., "Ultrathin Hafnium Oxide with Low Leakage and Excellent Reliability for Alternative Gate Dielectric Application," 4 pages, (1999).

S.P. Murarka et al., "Thermal Oxidation of Hafnium Silicide Films on Silicon," 3 pages, (1980).

Albert Chin et al., "High Quality $La_2O_3$ and $Al_2O_3$ Gate Dielectric with Equivalent Oxide Thickness 5-10A," 2 pages, (2000).

D.A. Muller et al., "The Electronic Structure at the Atomic Scale of Ultrathin Gate Oxides," 4 pages, (1999).

Y. Saito et al, "High-Integrity Silicon Oxide Grown at Low-Temperature by Atomic Oxygen Generated in High-Density Krypton Plasma," 2 pages, (1999).

Ying Shi et al., "Tunneling Leakage Current in Ultrathin (<4nm) Nitride/Oxide Stack Dielectrics," 3 pages (1998).

* cited by examiner

CAPACITOR STRUCTURES

RELATED PATENT DATA

This patent resulted from a divisional application of U.S. patent application Ser. No. 10/174,434, filed on Jun. 17, 2002, which resulted from a divisional application of U.S. patent application Ser. No. 09/881,408, filed on Jun. 13, 2001 now U.S. Pat. No. 7,037,862.

TECHNICAL FIELD

The present invention relates generally to methods of forming dielectric layers and the devices fabricated therewith. More specifically, the present invention relates to methods of forming dielectric layers having high dielectric constants by depositing oxidizable materials over a semiconductor substrate and oxidizing the materials to form amorphous oxides. The invention also pertains to devices formed employing such oxides.

BACKGROUND

Increasing the performance of integrated circuits (ICs), both with regard to more complex functionality and higher speeds, is a primary goal of efforts in advancing the semiconductor arts. One method that has been extensively employed to achieve this goal is scaling, that is decreasing area or size of individual device components that are used to form such integrated circuits. For example, the gate length of a typical MOS transistor has been reduced over the past several years from several microns to fractions of a micron and gate lengths of 0.1 micron or less will soon be desired. Such scaling efforts have also effected the size of capacitors used in a variety of ICs such as DRAMS and SRAMS (dynamic and static random access memories, respectively).

While such scaling efforts have resulted in the desired increases in performance, generally such size reductions also impact at least some characteristics of the devices so "scaled." For example, reducing the gate length of a transistor generally reduces the transistor's output and decreasing the size of a capacitor generally reduces the capacitance or amount of charge such a capacitor can store. Fortunately, changing other features of devices such as transistors and capacitors has made it possible to retain or at least control such changes in their aforementioned characteristics. Thus as transistor gate length has been reduced, the gate dielectric layer's thickness has also been reduced to at least partially compensate for the change in device output. Similarly, as the size of capacitor structures has been reduced, materials such as hemispherically grained polysilicon (HSG) have been employed to increase the effective surface area of such structures and compensate, at least in part, for such size reductions.

However, it appears likely that as scaling continues such exemplary compensation techniques may not be possible. Silicon dioxide ($SiO_2$), with a dielectric constant of about 3.9, remains the most common material employed for gate dielectric layers. To maintain transistor output at an acceptable level, a transistor having a gate length of 0.1 micron will require an ultra-thin $SiO_2$ layer with a thickness of about 2 nanometers (nm). Ultra-thin being defined herein as a thickness of about 5 nm or less.

The forming and use of such ultra-thin $SiO_2$ layers is problematic for a variety of reasons since such layers consist of only a few layers of molecules. Thus only one additional or missing layer of molecules can have a dramatic effect on device performance; for example where a desired layer is four $SiO_2$ molecules thick, a change of one molecule will change a characteristic such as the layer's capacitance by as much as 25%. In addition, such thin layers typically exhibit high current leakage, for example due to band to band or Fowler-Nordheim tunneling. Such layers are also more susceptible to dopant penetration or diffusion through the layer thus changing the characteristics of an adjacent layer or region; for example boron diffusion from the gate electrode into the channel region alters channel characteristics.

One method of reducing these problems is the use of a thicker layer of an alternative dielectric material such as a metal oxide having a higher dielectric constant than that of $SiO_2$. For the purpose of illustration, a metal oxide gate dielectric having an appropriately high dielectric constant can be formed with a thickness several times that of a $SiO_2$ layer while having the performance characteristics of the thinner $SiO_2$ layer. Thus the thicker metal oxide layer is said to have the equivalent oxide thickness (EOT) of the thinner layer. Alternate metal oxide materials such as titanium oxide ($TiO_2$), aluminum oxide ($Al_2O_3$), tantalum oxide ($Ta_2O_5$) and others have therefore received attention as replacements for $SiO_2$. However, such alternate materials must exhibit, in addition to a high dielectric constant (greater than that of $SiO_2$), a large band-gap with a favorable band alignment, low interface state density, good thermal stability and the ability to be formed in a manner consistent with known semiconductor process methods at reasonable cost and yield. Unfortunately, many candidate metal oxide materials having an appropriately high dielectric constant, cannot meet these additional requirements. Thus it would be desirable to provide alternate dielectric materials and methods of forming such materials that are appropriate as a replacement for ultra-thin $SiO_2$ layers.

SUMMARY

Embodiments in accordance with the present invention provide dielectric materials, methods of forming such dielectric materials, and semiconductor devices that employ such dielectric materials. Such embodiments provide for the forming of a first metal-containing dielectric layer over a silicon-containing surface of a substrate and the forming of a second metal-containing dielectric layer on the first layer. In embodiments of the present invention, the first and second metal-containing dielectric layers encompass elements selected from Group IVB and Group IIIB of the Periodic Table of Elements, respectively.

In some embodiments, a silicon dioxide layer is first formed and a first metal-containing layer is formed overlying such silicon dioxide layer. Advantageously, the metal of the first layer encompasses an element that can combine with the oxygen of the silicon dioxide to form a metal oxide material of the first metal-containing dielectric layer and chemically reduce the silicon dioxide to silicon.

In some embodiments in accordance with the present invention, one or more metal-containing layers are exposed to an atmosphere that encompasses oxygen while heating the exposed layers to a temperature effective to transform such metal-containing layers to metal-containing dielectric oxide layers. In some embodiments, such exposing encompasses ion bombardment of the metal-containing layers, and in some embodiments such exposing encompasses providing oxygen radicals to the metal-containing layers.

Embodiments in accordance with the present invention provide for forming the first and second metal-containing dielectric layers having a wide ratio of relative thicknesses, for example from a ratio of about 1:5 to about 5:1 or greater.

In embodiments of the present invention, such forming can be provided by physical vapor deposition (PVD) where a metal-containing layer of each formed layer is first deposited having a thickness of about 10 nanometers (nm) or less. In embodiments of the present invention, such PVD methods include electron beam evaporation techniques or other methods for forming high purity material layers by PVD. For example in some embodiments, radio frequency or microwave energy is employed for heating rather than an electron beam.

Embodiments of the present invention can encompass semiconductor devices such as MOS transistors, capacitors and the like. Such devices are formed using metal-containing dielectric layers in accordance with the present invention.

Some embodiments encompass integrated circuits such as dynamic and static random access memories (DRAMs and SRAMs) which include transistors, capacitors and the like that are formed employing metal-containing dielectric layers in accordance with the present invention, where such layers are also formed by methods in accordance with the present invention. In some embodiments of the present invention, semiconductor devices encompassing a metal-containing dielectric layer have an equivalent oxide thickness (EOT) of 2 nm to 5 nm. Advantageously, metal-containing dielectric layers in accordance with the present invention having an EOT of less than 2 nm are also possible.

BRIEF DESCRIPTION OF THE DRAWINGS

Embodiments in accordance with the present invention are described below with reference to the following accompanying drawings.

DETAILED DESCRIPTION

This disclosure of the invention is submitted in furtherance of the constitutional purposes of the U.S. Patent Laws "to promote the progress of science and useful arts" (Article 1, Section 8).

Embodiments in accordance with the present invention will be described with reference to the aforementioned figures. Various modifications, adaptations or variations of the specific methods and or structures described may become apparent to those skilled in the art as embodiments of the present invention are described. All such modifications, adaptations or variations that rely upon the teachings of the present invention, and through which these teachings have advanced the art, are considered to be within the scope and spirit of the present invention.

To aid in interpretation of the description of the illustrations and claims that follow, the term "semiconductor substrate" is defined to mean any construction encompassing silicon semiconductive material, including, but not limited to, bulk silicon semiconductive materials such as a silicon semiconductor wafer (either alone or in assemblies encompassing other materials thereon) and silicon semiconductive material layers (either alone or in assemblies encompassing other materials). The term "substrate" refers to any supporting structure, including, but not limited to, the semiconductor substrates described above. In addition, the terms "high dielectric constant material" or "hi-K material" are used interchangeably herein and refer to materials having a dielectric constant that is greater than that of thermally grown silicon dioxide, which is generally understood to have a value of approximately 3.9 or higher.

Figure 1:
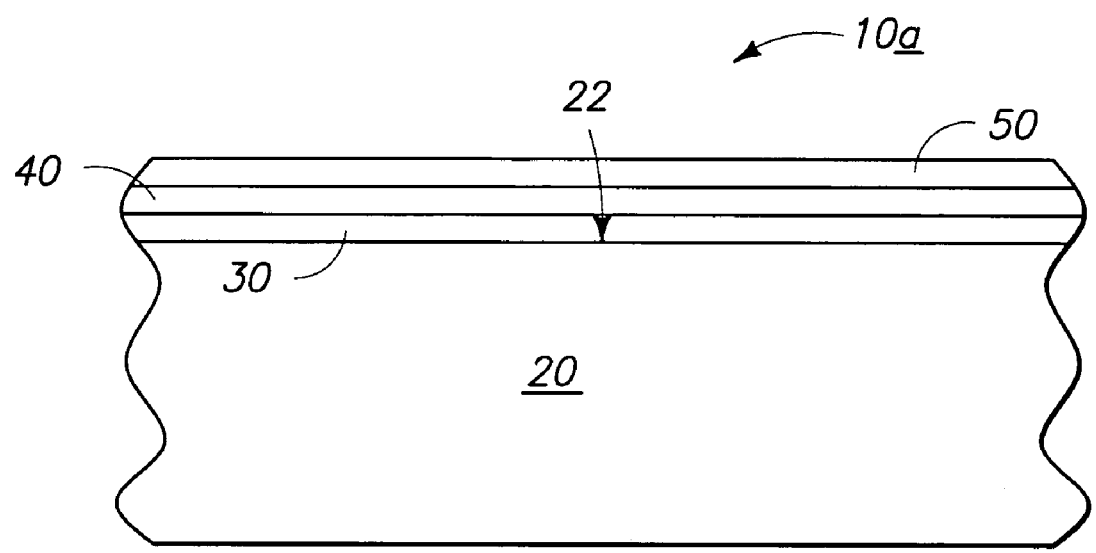
FIG. 1 is a cross-sectional view of a semiconductor wafer fragment depicting an embodiment in accordance-with the present invention at an early step in the formation of a dielectric layer.

Referring to FIG. 1, semiconductor wafer fragment 10a is shown depicted at an early processing step of an embodiment in accordance with the present invention. Wafer fragment 10a encompasses a semiconductive substrate 20, shown having a surface 22, a silicon dioxide layer 30 overlying surface 22, a first metal-containing layer 40 overlying layer 30 and a second metal-containing layer 50 overlying layer 40.

As described above, semiconductive substrate 20 is defined to mean any construction encompassing silicon semiconductive material. Generally a cross-sectional representation of such a semiconductive substrate 20, will include a variety of doped regions as are needed to form semiconductor device structures. Some of such doped regions, for example well regions, being present even at an early stage of processing. However, for ease of understanding the present invention, such doped regions that may be present are not shown in FIG. 1.

Surface 22 is an outermost boundary of substrate 20. For illustrative purposes, surface 22 can be an upper surface of a single crystal silicon substrate, an epitaxially grown silicon layer or any other appropriate silicon-containing material. Silicon dioxide layer 30 is an optional layer. That is to say that, in some embodiments of the present invention such a layer is present at this early stage in the processing and in some it is not present. In addition, it will be understood that in those embodiments where the optional silicon dioxide layer 30 is present, such layer is either a "native" oxide layer or an oxide layer that is formed to have a specific thickness by a process selected for the forming of such a layer. Where silicon dioxide layer 30 is a "native" oxide layer, it will be understood that such a layer is formed spontaneously upon exposure of silicon surface 22 to an oxygen-containing ambient, generally at or near room temperature. Alternatively, where silicon dioxide layer 30 is a purposely grown layer, such layer results from exposure of surface 22 to oxidizing conditions such as an oxidizing ambient, at an elevated temperature. Furthermore it will be understood that "native" oxide layers are essentially self-limiting in thickness and are generally limited to about one or two molecular mono-layers in thickness. However, where layer 30 is a purposely grown layer, such layer can be formed having essentially any thickness and where employed in embodiments of the present invention, is typically grown to a few nanometers in thickness, for example, 5 nanometers or less, although any other thickness is also appropriate.

Generally, where electrical contact to surface 22 is desired, it is known to remove such a layer as oxide layer 30 from over all or some portions of surface 22 prior to forming any layer from which the electrical contact will be made. For example, Maiti et al. (U.S. Pat. No. 6,020,024, entitled "Method for Forming High Dielectric Constant Metal Oxides," hereinafter US'024) state at column 2, lines 61-65, that semiconductor substrate 12 (FIG. 1) "has preferably been pre-cleaned in order to minimize the oxide at its surface with an HF clean and/or hydrogen ($H_2$) anneal step. In an alternative, a plasma $N_2O$ process may be used to remove substrate native oxide." As will be described below, embodiments in accordance with the present invention can advantageously eliminate such a processing step. That is to say, that in some embodiments of the present invention, where a silicon oxide layer 30 is formed or allowed to form, no specific removal step is needed.

Still referring to FIG. 1, first metal-containing layer 40 is shown overlying optional silicon oxide layer 30. Layer 40 is generally formed of a metal selected from the elements of Group IVB of the Periodic Table of the Elements. As known, such group is generally understood to include the elements titanium (Ti), zirconium (Zr), hafnium (Hf) and rutherfordium (Rf) which generally form chemically and thermally stable oxides having attractively high dielectric constants, for example the oxide of hafnium is reported to have a dielectric constant (k) of about 27. While embodiments of the present invention encompass any of the Group IVB elements, it has been found that a hafnium-containing layer 40 is advantageous since (1) hafnium oxide ($HfO_2$) is the most stable oxide of the group of oxides, (2) hafnium is capable of reducing a silicon oxide layer, (3) hafnium silicide is readily oxidized and (4) $HfO_2$ is resistive to impurity diffusion.

In some embodiments of the present invention, the thickness of layer 40 will be 1 nanometer (nm) or less, while in other embodiments the thickness will be as much as approximately 5 nm or more. Such variations in thickness are a function of, among other things, the use or non-use of the optional silicon dioxide layer 30, and the purpose for which a finally formed dielectric layer, in accordance with the present invention, is intended. For example, as will be discussed below, in some embodiments of the present invention a gate dielectric layer is formed and in other embodiments of the present invention a capacitor dielectric layer is formed. As one of ordinary skill in the art is aware, the thickness of such layers can vary widely.

Metal-containing layer 40 is most advantageously formed by a physical vapor deposition process (PVD). While any of the several common PVD processes such as sputtering or evaporation can be used, it is found advantageous to use an evaporative process and in particular an electron beam evaporative process. For example, where an electron beam evaporative process is employed, it is found that an initial purity level of the source material for the PVD process can be provided to layer 40. That is to say that the level of purity of the source material and initially deposited metal-containing layer is essentially unchanged. However, it will be understood that the other methods of forming metal-containing layer 40 are within the scope and spirit of the present invention, for example evaporation methods where a heating source other than an electron beam is employed or any other appropriate PVD method capable of providing the initial purity level of the source material to layer 40, can also be advantageously used.

Still referring to FIG. 1, second metal-containing layer 50 is shown overlying first metal layer 40. In accordance with embodiments of the present invention, metal-containing layer 50 is advantageously formed of a metal selected from the elements of Group IIIB of the Periodic Table of the Elements. As known, Group IIIB is generally understood to encompass scandium (Sc), yttrium (Y), lanthanum (La) and actinium (Ac). Embodiments of the present invention encompass Group IIIB elements, as such elements form dielectric oxides that have high thermodynamic stability and a generally suitable dielectric constant. Of such Group IIIB elements, it has been found that a lanthanum-containing layer 50 is advantageous at least because (1) lanthanum oxide ($La_2O_3$) has a dielectric constant similar to that of $HfO_2$(k=27 for $La_2O_3$ and k=24 for $HfO_2$) and (2) $La_2O_3$ has high thermodynamic stability. Thus changes in the relative thickness for layers 40 and 50 that can change the ratio of thicknesses for the layers from between about 1:5 to about 5:1, will result in only small changes, if any, in the dielectric constant of the stacked oxide layer subsequently formed.

Generally, metal-containing layer 50 is formed in the same manner as is metal-containing layer 40. That is to say, by using a physical vapor deposition (PVD) method as previously described. However, while layers 40 and 50 can be formed in distinct PVD processes, it is generally advantageous to form both layers using a single, unified PVD process. For example, such a unified deposition or forming process would generally provide that substrate 10a is placed into a PVD system and a material of the first metal-containing layer 40 is formed thereon until a desired thickness of layer 40 is formed. In some embodiments, once a first thickness of first layer 40 is obtained, the forming of first layer 40 is stopped and a forming of second layer 50 is begun within the same PVD system. Subsequently, the forming of second layer 50 is stopped once a desired second thickness for such layer is obtained or when a desired total thickness of layers 40 and 50 is obtained.

In some embodiments, after the first thickness of layer 40 is formed, the forming of layer 50 is begun without a prior stopping of the deposition of the material of layer 40. In this manner the material of second metal-containing layer 50 will be combined with some material of first metal-containing layer 40 in at least an interfacial region (not shown) of such second layer 50. It will be understood that in some embodiments, such a mixing of the materials of first layer 40 and second layer 50 is limited to such an interfacial region by stopping the forming of the material of layer 40 after the forming of the material of layer 50 is started. In other embodiments, the forming of the material of layer 40 is not stopped once the forming of the material of layer 50 is started, rather both materials are formed until a desired thickness is obtained thus, essentially all of second layer 50 is a mixture of materials. In addition, as discussed for first metal-containing layer 40, a desired thickness for second metal-containing layer 50 can also vary as a function of the several factors mentioned for layer 40 as well as the thickness of first layer 40 previously deposited. Thus, the thickness of such layer 50 generally has the same range as provided above for the thickness of layer 40.

It has also been found that in some embodiments in accordance with the present invention a specific ratio of thickness for first layer 40 to second layer 50 is advantageous. For example where an optional silicon oxide layer 30 is used, generally a thin layer of a hafnium-containing metal layer 40 is formed, about 1 nm or less, and employed to reduce such silicon oxide layer 30 prior to forming second layer 50. The subsequent second metal-containing layer 50 is formed with an appropriate thickness, for example a layer of lanthanum-containing metal having a thickness of between about 3 to 5 nm. Advantageous thickness ratios of first metal-containing layer 40 to second metal-containing layer 50 have been found to vary with ratios from about 1:5 to about 5:1 being typical.

Figure 2:
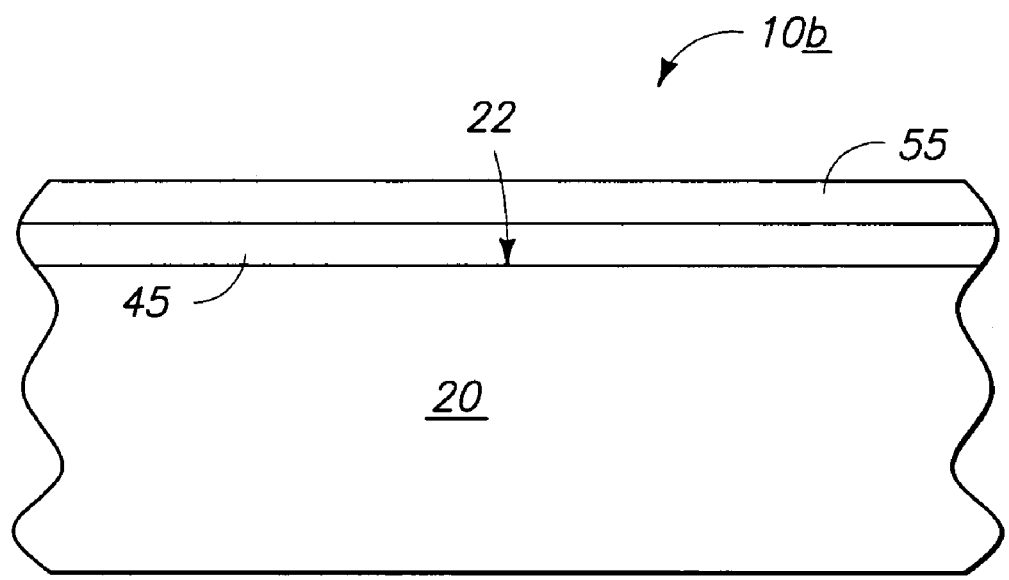
FIG. 2 is a cross-sectional view of a semiconductor wafer fragment depicting the embodiment of FIG. 1 at a subsequent step in the formation of a dielectric layer.

Turning now to FIG. 2, a cross-sectional view of a semiconductor wafer fragment 10b depicting the embodiment of FIG. 1 at a subsequent processing step is depicted. As shown, a first metal-containing dielectric layer 45 overlies surface 22 of semiconductive substrate 20 and a second metal-containing dielectric layer 55 overlies the first layer 45.

First metal-containing dielectric layer 45 and second metal-containing dielectric layer 55 are formed from first metal-containing layer 40 and second metal-containing layer 50 (of FIG. 1), respectively. Generally, a transformation from metal-containing layers to metal-containing dielectric layers is performed. Such transformation typically encompassing oxidizing the metal-containing layers to form amorphous metal oxide containing material layers. In some embodiments of the present invention, such an oxidation process is accomplished after deposition of both the first and second metal-containing layers. In other embodiments oxidation of the first metal-containing layer to form the first metal-containing dielectric layer precedes formation of the second metal-containing layer. In yet other embodiments of the present invention, oxidation of one or both of the metal-containing layers is performed during the forming of one or the other of such layers. By means of example, in one such method where optional silicon oxide layer 30 is present, a hafnium-containing layer 40 is formed over layer 30 and subsequently exposed to conditions such that the hafnium of layer 40 combines with the oxygen of silicon oxide layer 30 to form a hafnium-containing dielectric layer 45 comprising hafnium oxide ($HfO_2$). Such a method of forming a metal oxide by the chemical reduction of silicon dioxide of layer 30 to silicon makes it possible to skip the separate removal step for the silicon oxide layer that is taught by Maiti et al. in the previously mentioned US'024. It will be noted that since silicon dioxide layer 30 is reduced to silicon, the thickness of such layer 30 is combined with substrate 20 in FIG. 2. When such hafnium metal-containing layer is oxidized, a second lanthanum-containing layer is formed and subsequently oxidized by an appropriate method. While such example specifically refers to Hf and La, it will be understood that the other elements of Group IVB and IIIB, such as Zr and Y, respectively, could also be employed, although the relative reactivity of the materials will vary.

Generally, conditions for the chemical reduction of optional silicon oxide layer 30 with the material of layer 40 encompass providing temperatures between about 200° C. and 400° C. as an inert atmosphere is typically provided such that layer 30 is essentially the only source of oxygen present. However, where silicon oxide layer 30 is not present, or after the chemical reduction of such silicon dioxide layer, other methods for the oxidation of portions of layer 40 not completely oxidized and/or layer 50 are employed. Such other methods include, but are not limited to, the use of remotely formed oxygen radicals; ion bombardment of such metal layers with oxygen ions and thermal oxidation of such layers in an oxygen comprising atmosphere at appropriate temperatures. Typically such low energy ion bombardment is performed using relatively high plasma densities, typically above $10^{12}/cm^3$, and low electron temperature, generally less than 1.3 eV, and where oxygen radicals are used, generally such radicals are formed using appropriate radio frequency or microwave energy which is applied to an oxygen comprising gas stream at a reduced pressure. In addition, generally the use of ion bombardment and/or oxygen radicals is provided in combination with a thermal treatment. By means of example, it is found effective to convert metal-containing layers 40 and 50 to their respective metal-containing dielectric layers 45 and 55 by providing ion bombardment of the layers using a mixed gas with about 3% to 5% oxygen in an inert carrier such as Ar or Kr. The layers are held in such gas mixture at a pressure of about 1 Torr and a temperature of about 250° C. to about 300° C. with a microwave power source applying a power density of about 3-7 $W/cm^2$. It will be understood that such oxidation conditions represent only one effective method and that other appropriate and effective methods can be used to form one or both of dielectric layers 45 and 55 from layers 40 and 50 either collectively or individually.

Figure 3:
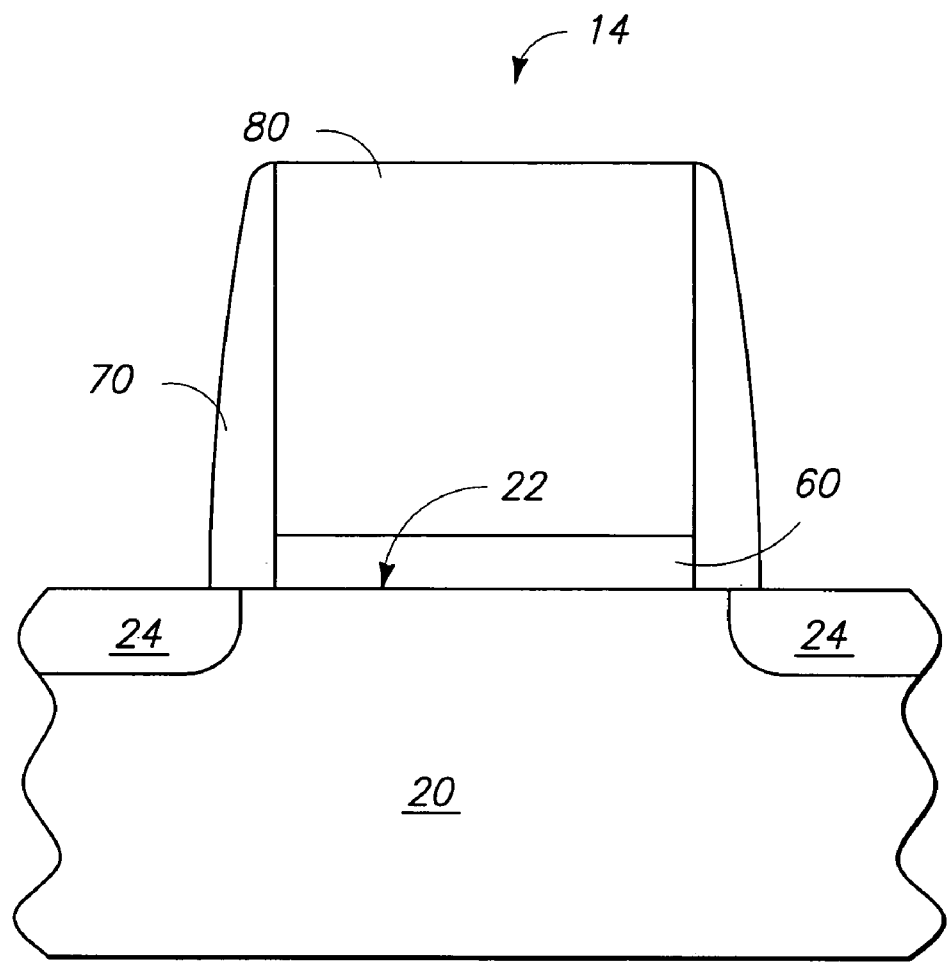
FIG. 3 is a cross-sectional view of a simplified representation of an MOS transistor formed in accordance with embodiments of the present invention.

Referring to FIG. 3, an MOS transistor 14 formed in accordance with embodiments of the present invention is depicted. Gate dielectric 60 is disposed over a portion of surface 22 of substrate 20 as well as adjacent to and elevationally above source/drain (S/D) regions 24. In accordance with embodiments of the present invention, gate dielectric 60 encompasses metal-containing dielectric layers 45 and 55 (FIG. 2) where such layers are formed as described above and subsequently patterned using any of the appropriate methods for patterning a gate electrode 80 and dielectric 60. S/D regions 24 and sidewall spacers 70 are also formed by appropriate methods. It will be understood that transistor 14 is a simplified transistor representation, and that more complex transistor structures are also encompassed by embodiments of the present invention. For example, in some embodiments, transistor 14 is a MOSFET having an gate dielectric layer 60 that has an equivalent oxide thickness (EOT) of 2 nm or less while having an actual thickness of as much as about 6 nm. Such an advanced MOSFET can also have a gate length of about 0.25 micron or less and be encompassed within an integrated circuit such as a dynamic random access memory (DRAM), static random access memory (SRAM) or any of the various other memory integrated circuits. Transistor 14 can also encompass a gate dielectric layer 60 that has an EOT of greater than 2 nm and a gate length of more than 0.25 micron.

Transistor or integrated circuit embodiments in accordance with the present invention that have an equivalent oxide thickness of about 2 nm or less, advantageously provide for readily forming gate dielectric layer 60 having a desired EOT that would not be otherwise practical. Thus, methods for incorporating materials with high-dielectric constants, such as oxides of Group IIIB and IVB metals, over a silicon substrate are provided where such materials can be formed into a stacked amorphous metal oxide-containing gate dielectric structure such as gate dielectric 60.

Figure 4:
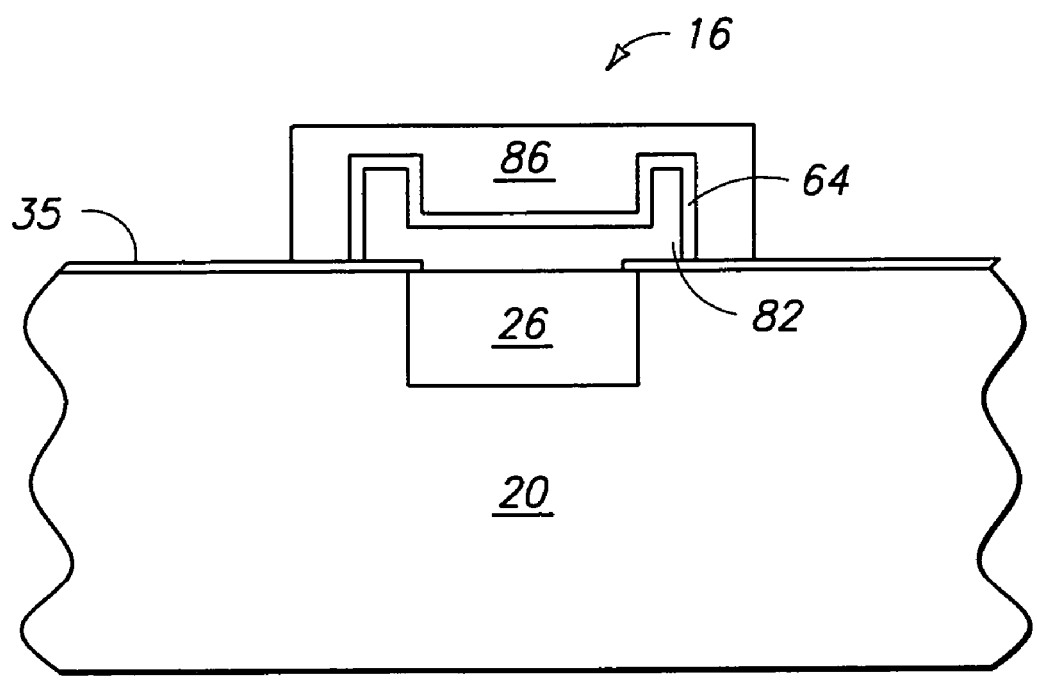
FIG. 4 is a cross-sectional view of a simplified representation of a capacitor structure formed in accordance with embodiments of the present invention.

Turning now to FIG. 4 a simplified capacitor structure 16, formed in accordance with embodiments of the present invention, is depicted. Capacitor structure 16 is shown overlying a doped region 26, disposed in semiconductive substrate 20. A lower capacitor electrode 82 electrically contacts region 26, a capacitor dielectric 64 overlies electrode 82 and a second capacitor electrode 86 overlies capacitor dielectric 64.

Capacitor dielectric 64 is advantageously formed from first and second metal-containing layers deposited over lower electrode 82 in a manner analogous to that described previously with FIGS. 1 and 2. Thus, after first forming and patterning lower capacitor electrode 82, first and second metal-containing layers (not shown) are formed and transformed by appropriate methods into metal-containing dielectric layers which are encompassed within capacitor dielectric layer 64.

The previously described methods of converting Group IVB and IIIB metals into metal oxides are not limited to extremely thin films, thus thicker metal-containing layers, suitable for forming capacitor dielectric layers having a thickness of 10 nm or more, can be first deposited and then transformed into a metal-containing dielectric layer. As previously mentioned, Group IVB metal oxides in general and $HfO_2$ in particular, are/is resistant to impurity diffusion so that such materials can be oxidized over a lower capacitor electrode 82 formed from silicon-comprising materials such as any of the various forms of polycrystalline silicon without oxidizing such lower electrode 82.

In compliance with the statute, the invention has been described in language more or less specific as to structural and methodical features. In addition, advantages of the invention of the instant application have become apparent by and through the descriptions and examples provided. Thus it will be understood that the use of stacked amorphous gate oxide layers formed of Group IVB and IIIB metal oxides advantageously provides a final layer that has a high dielectric constant of about 27 to 29, and is both thermally stable and protective of underlying layers to impurity diffusion. It will be understood that the selection of Hf and La forming the metal-containing layers is particularly advantageous although other metals from Group IVB and IIIB are also appropriate. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A capacitor structure comprising:
a first capacitor electrode;
a capacitor dielectric layer comprising:
   a hafnium-containing dielectric layer contacting the first capacitor electrode;
   a metal-containing dielectric layer contacting the hafnium-containing dielectric layer, the metal of the metal-containing dielectric layer selected from Group IIIB of the Periodic Table of the Elements; and
a second capacitor electrode overlying the metal-containing dielectric layer.

2. The capacitor structure of claim 1, where the metal-containing dielectric layer is spaced from the first capacitor electrode by the hafnium-containing dielectric layer.

3. The capacitor structure of claim 1, where:
the hafnium-containing dielectric layer has a first thickness;
the metal-containing dielectric layer comprises a lanthanum-containing dielectric layer having a second thickness; and
wherein a ratio of the first thickness to the second thickness is from about 1 to 4 to about 4 to 1.

4. The capacitor structure of claim 3, where the ratio is from about 1 to 3 to about 1 to 4.

5. The capacitor structure of claim 1, where the hafnium-containing dielectric layer consists of metal oxide.

6. A capacitor structure comprising:
a first capacitor electrode having a silicon-containing surface;
a capacitor dielectric layer including:
   a first metal-containing dielectric layer consisting of metal oxide and contacting the silicon-containing surface, the metal of the first metal-containing layer being selected from Group IVB of the Periodic Table of the Elements; and
   a second metal-containing dielectric layer consisting of metal oxide and contacting the first metal-containing dielectric layer, the metal of the second metal-containing layer being selected from Group IIIB of the Periodic Table of the Elements; and
a second capacitor electrode overlying the second metal-containing dielectric layer.

7. The capacitor of claim 6, where the second metal-containing dielectric layer is spaced from the silicon-containing surface by the first metal-containing dielectric layer.

8. The capacitor of claim 6, where the first metal-containing dielectric layer comprises hafnium and the second metal-containing dielectric layer comprises lanthanum and where the first metal-containing dielectric layer and the second metal-containing dielectric layer have a total thickness of about 6 nm or less.

9. The capacitor of claim 8, where the hafnium-containing dielectric layer has a first thickness and the lanthanum-containing dielectric layer has a second thickness, the second thickness being from about one fourth to four times the first thickness.

10. The capacitor of claim 6, where:
the first metal-containing dielectric layer is a hafnium-containing dielectric layer having a first thickness no greater than about 1 nm;
the second metal-containing dielectric layer is a lanthanum-containing dielectric layer having a second thickness of no greater than about 5 nm; and
wherein a ratio of the first thickness to the second thickness is from about 1 to 3 to about 1 to 4.

11. A capacitor structure comprising:
a first capacitor electrode having a silicon-containing surface;
a dielectric layer including:
   a first dielectric layer consisting of hafnium oxide and contacting the silicon-containing surface; and
   a second dielectric layer consisting of lanthanum oxide and contacting the first dielectric layer; and
a second capacitor electrode overlying the dielectric layer.

12. The capacitor of claim 11, where the second metal-containing dielectric layer is spaced from the silicon-containing surface by the first metal-containing dielectric layer.

13. The capacitor of claim 11, where the first metal-containing dielectric layer and the second metal-containing dielectric layer have a total thickness of about 6 nm or less.

14. The capacitor of claim 13, where the first dielectric layer has a first thickness and the second dielectric layer has a second thickness, the second thickness being from about one fourth to four times the first thickness.

15. The capacitor of claim 11, where:
the first dielectric layer has a first thickness no greater than about 1 nm;
the second dielectric layer has a second thickness of no greater than about 5 nm; and
wherein a ratio of the first thickness to the second thickness is from about 1 to 3 to about 1 to 4.

16. A capacitor structure comprising:
a first capacitor electrode having a silicon-containing surface;
a dielectric layer consisting of:
   a first dielectric layer consisting of metal oxide and contacting the silicon-containing surface, the metal of the first dielectric layer being selected from Group IVB of the Periodic Table of the Elements; and
   a second dielectric layer consisting of metal oxide and contacting the first dielectric layer, the metal of the second dielectric layer being selected from Group IIIB of the Periodic Table of the Elements; and
a second capacitor electrode overlying the dielectric layer.

* * * * *